(12) United States Patent
Kwak et al.

(10) Patent No.: US 6,762,103 B2
(45) Date of Patent: Jul. 13, 2004

(54) METHOD OF FORMING AN ISOLATION FILM IN A SEMICONDUCTOR DEVICE

(75) Inventors: Noh Yeal Kwak, Kyungki-Do (KR); Sang Wook Park, Seoul (KR); Cha Deok Dong, Ichon-Shi (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 10/617,269

(22) Filed: Jul. 10, 2003

(65) Prior Publication Data

US 2004/0063281 A1 Apr. 1, 2004

(30) Foreign Application Priority Data

Jul. 12, 2002 (KR) .............................. 10-2002-0040691

(51) Int. Cl.[7] ............................................ H01L 21/336
(52) U.S. Cl. ........................ 438/296; 438/297; 438/298
(58) Field of Search ................................ 438/294–298, 438/439–452

(56) References Cited

U.S. PATENT DOCUMENTS

| 6,265,292 | B1 | * | 7/2001 | Parat et al. ................. 438/524 |
| 6,323,106 | B1 | * | 11/2001 | Huang et al. ............... 438/433 |
| 6,504,219 | B1 | * | 1/2003 | Puchner et al. ............. 257/371 |

* cited by examiner

*Primary Examiner*—Dung A. Le
(74) *Attorney, Agent, or Firm*—Marshall, Gerstein & Borun LLP

(57) ABSTRACT

Disclosed is a method of forming an isolation film in semiconductor devices using a shallow trench. Trenches are formed in silicon substrates of a memory cell region and a peripheral circuit region. The inert ion is then injected into the surface of the trench in the peripheral circuit region, thus forming an amorphous layer. Thereafter, an oxidization process is implemented so that a thick oxide film is grown due to excessive oxidization at the amorphous layer, thus making thicker the trench in the peripheral circuit region than the trench in the memory cell region by a thickness of the oxide film.

18 Claims, 4 Drawing Sheets

METHOD OF FORMING AN ISOLATION FILM IN A SEMICONDUCTOR DEVICE

BACKGROUND OF THE INVENTION

1. Field of the Invention

The present invention relates to a method of forming an isolation film in a semiconductor device using a shallow trench, and more particularly, to a method of forming an isolation film in semiconductor devices by which the depths of trenches in a memory cell region and a peripheral circuit region are differently formed.

2. Background of the Related Art

As the degree of integration in semiconductor memory devices is increased, the size of the memory cell is reduced. Therefore, in implementing the flash memory device recently, an isolation film using a shallow trench is employed in order to secure the ratio of the memory cell per wafer.

In the flash memory device having electrical programming and erasing functions, a high voltage is applied to a control gate of the memory cell upon programming and erasing. Due to this, many transistors for high voltage are used in the flash memory devices.

Upon formation of the isolation film conventionally, however, trenches having the same depths are formed in the memory cell region and the peripheral circuit region. Therefore, many electrical problems occur due to application of the high voltage.

In case of the DRAM, a bias voltage of the maximum 5V is applied. In case of the flash memory, however, a bias voltage of 18~24V is applied. If the depth of the trench in the peripheral circuit region is made shallow, a punch through occurs in the well of the NMOS transistor and the PMOS transistor. Further, if the depth of the trench in the memory cell region is made deep, the sheet resistance in the common source is increased, so that the operating speed is lowered during the programming, erasing and reading operation in a block unit. This reduction in the operating speed causes a problem due to difference between the bias voltages for programming, erasing and reading.

It is thus required that the depths of the trenches in the memory cell region and the peripheral circuit region be differently formed. A conventional method includes one by which trenches having difference depths are formed in the memory cell region and the peripheral circuit region, respectively, using different mask patterns, or one by which trenches having the same depths are formed in the memory cell region and the peripheral circuit region, respectively, and the depth of the trench in the peripheral circuit region is increased by means of etch process using a given mask.

However, the above methods have the following disadvantages. First, it is difficult to form the trenches having the same depths on the entire wafer in view of etch process. Second, residues are created due to difference in the etch depth. Third, the leakage current occurs due to damage of the substrate depending on physical etch, in particular etch damage of the bottom of the trench, and a punch through problem thus occurs in the device for high voltage. Fourth, the productivity is lowered due to addition of etch process for increasing the depth of the trench in the peripheral circuit region.

SUMMARY OF THE INVENTION

Accordingly, the present invention is contrived to substantially obviate one or more problems due to limitations and disadvantages of the related art, and an object of the present invention is to provide a method of forming an isolation film in semiconductor devices by which trenches are formed in silicon substrates of a memory cell region and a peripheral circuit region, an inert ion is implanted into the surface of the trench in the peripheral circuit region to form an amorphous layer, and an oxidization process is then implemented to grow a thick oxide film by means of excessive oxidization at the amorphous layer.

In a preferred embodiment, a method of forming an isolation film in semiconductor devices according to the present invention is characterized in that it comprises the steps of forming a mask pattern on a silicon substrate in a memory cell region and a peripheral circuit region and then etching an exposed portion of the silicon substrate by a given depth to form a shallow trench, implanting an inert ion into the surface of the trench in the peripheral circuit region, implementing an oxidization process so that an oxide film is grown on the surfaces of the trenches in the memory cell region and the peripheral circuit region, wherein the depth of the trench in the peripheral circuit region is increased due to excessive oxidization at the portion in which the ion is implanted, and forming an oxide film on the entire structure so that the trench is buried and planarizing the surface of the oxide film.

The inert ion is entire silicon (Si) or argon (Ar). The oxidization process is implemented at a temperature of 800~1100° C. to a target thickness of 30~150 Å.

The method further comprises the step of after the inert ion is implanted, performing a rapid thermal oxidization process using a spike annealing process so that an anti-diffusion layer is formed at the bottom of the trench. The spike annealing process is implemented at a temperature of 850~1100° C. and the ramp-up ratio is controlled to be 100~250° C./sec.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

In another aspect of the present invention, it is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

In the present invention, trenches having different depths are formed in a memory cell region and a peripheral circuit region, respectively, by maximizing the oxidization force of silicon (Si) through ion implantation. In other words, the trenches are formed in the memory cell region and the silicon substrate of the peripheral circuit region. Inert ions are then implanted into the trench of the peripheral circuit region, thus making amorphous the silicon substrate on the surface of the trench. Next, an oxidization process is performed so that a thick oxide film is grown on the surface of the trench due to excessive oxidization at the amorphous layer. Accordingly, the trench of the peripheral circuit region becomes deeper than the trench of the memory cell region by the thickness of the oxide film.

FIG. 1A~FIG. 1D are graphs illustrating the trend of oxidization depending on arsenic (As) ion implantation, wherein a temperature is 850° C. and a target thickness is 30 Å.

Figure 1A:
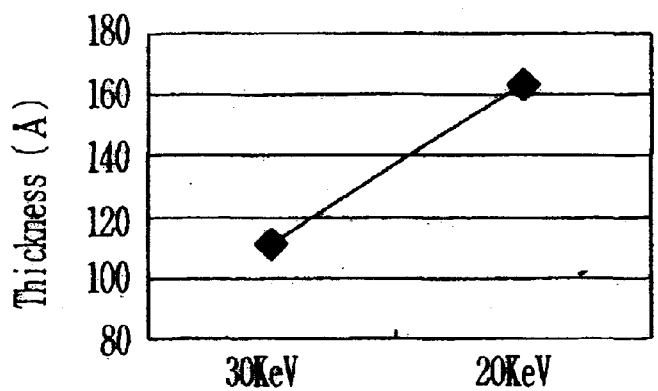
FIG. 1A~FIG. 1D are graphs illustrating the technical principle of the present invention.
Figure 1B:
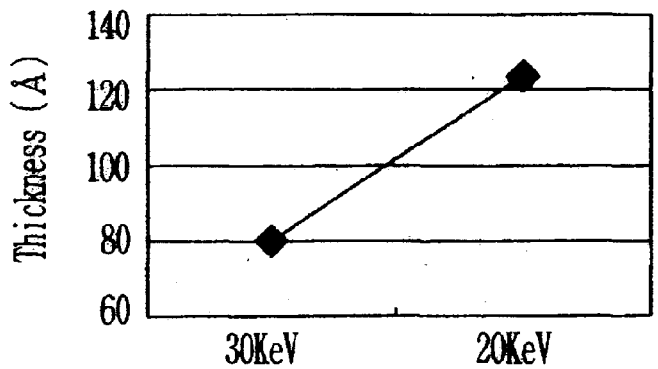
Figure 1C:
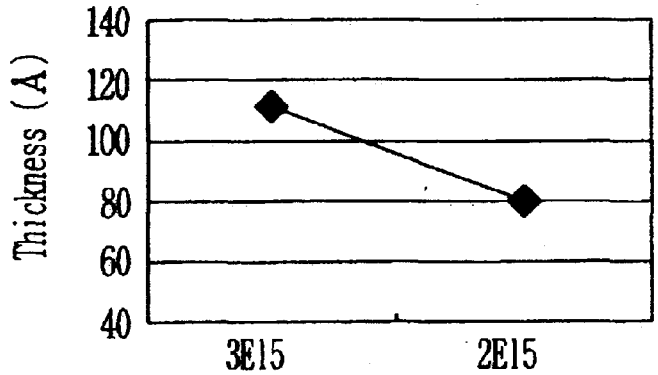
Figure 1D:
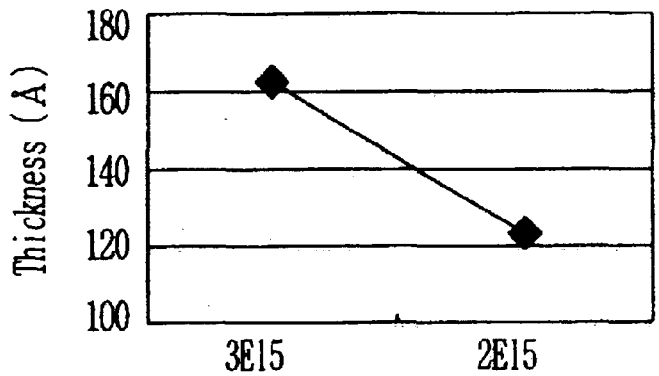

FIG. 1A and FIG. 1B illustrate the growth thickness of the oxide film depending on ion implantation energy when the dose is controlled to be 3E15 cm$^{-2}$. FIG. 1C and FIG. 1D illustrate the growth thickness of the oxide film depending on the dose when ion implantation energy is controlled to be 30 KeV and 20 KeV, respectively.

From the drawings, it could be seen that the degree of oxidization is different depending on an ion implantation condition and an oxidization condition. It could be seen that the oxide film thicker 5~10 times by maximum when arsenic (As) is implanted than when ion is not implanted could be obtained.

As in arsenic (As), however, the dopant having an electrical characteristic can generate an electric field and a leakage current at the bottom of the trench. In the present invention, silicon (Si) or argon (Ar) ion being an inert dopant having no electrical characteristic is used. It was found that silicon (Si) ion has a good oxidization force.

Reference will now be made in detail to the preferred embodiments of the present invention, examples of which are illustrated in the accompanying drawings.

FIG. 2A~FIG. 2F are cross-sectional views of semiconductor devices for explaining a method of forming an isolation film according to a preferred embodiment of the present invention.

Figure 2A:
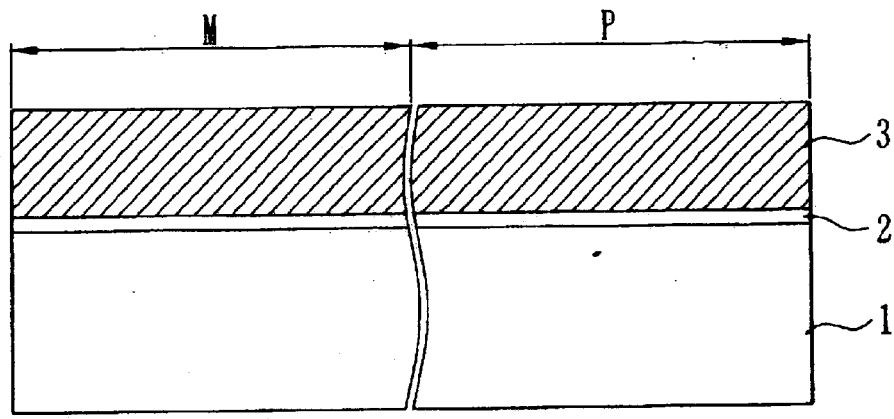
FIG. 2A~FIG. 2F are cross-sectional views of semiconductor devices for explaining a method of forming an isolation film according to a preferred embodiment of the present invention.

FIG. 2A is the cross-sectional view of the semiconductor device in which a pad oxide film 2 and a pad nitride film 3 are sequentially formed on a silicon substrate 1 in a memory cell region M and a peripheral circuit region P.

The pad oxide film 2 is formed in order to prohibit crystal defects on the surface of the silicon substrate 1 and for the purpose of surface processing. The pad oxide film 2 is formed in thickness of 70~100 Å by performing a pre-treatment cleaning process using DHF(50:1)+SC-1 (NH$_4$OH/H$_2$O$_2$/H$_2$O) or BOE(100:1 or 300:1)+SC-1 (NH$_4$OH/H$_2$O$_2$/H$_2$O) solution and then performing dry oxidization or wet oxidization process at a temperature of 750~800° C.

Further, the pad nitride film 3 is formed in thickness of 900~2000 Å by means of a low-pressure chemical vapor deposition (LPCVD) method.

Figure 2B:
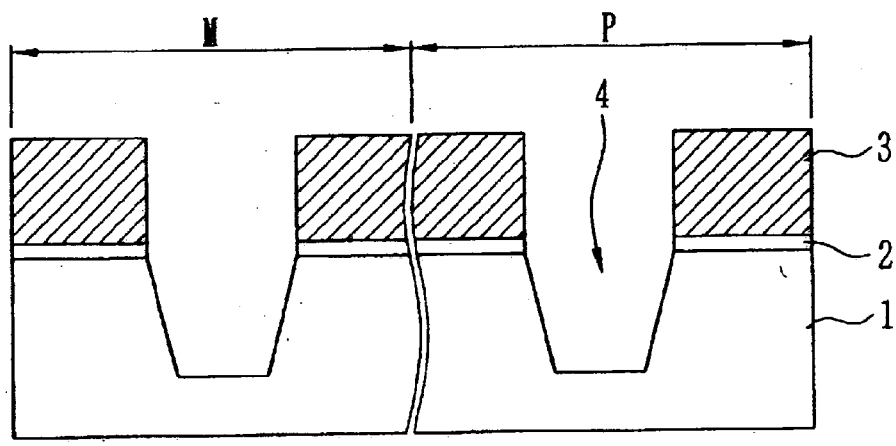

FIG. 2B illustrates the cross-sectional of the semiconductor device in which the pad nitride film 3 and the pad oxide film 2 are sequentially patterned using an isolation mask and an exposed portion of the silicon substrate 1 is then etched by a given depth, thus forming trenches 4. The trenches 4 have sidewalls having a tilt angle of 80~85°.

Figure 2C:
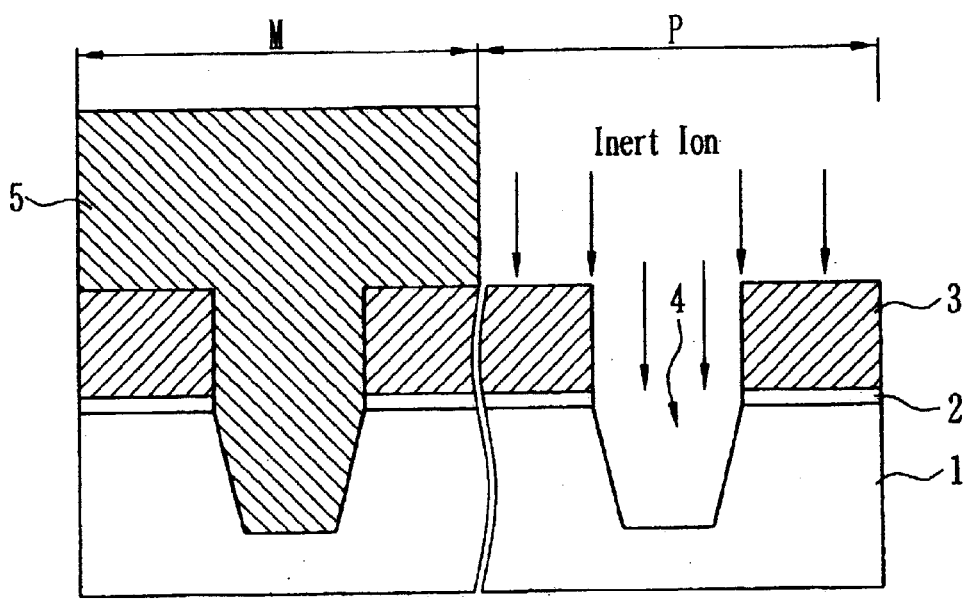
Figure 2D:
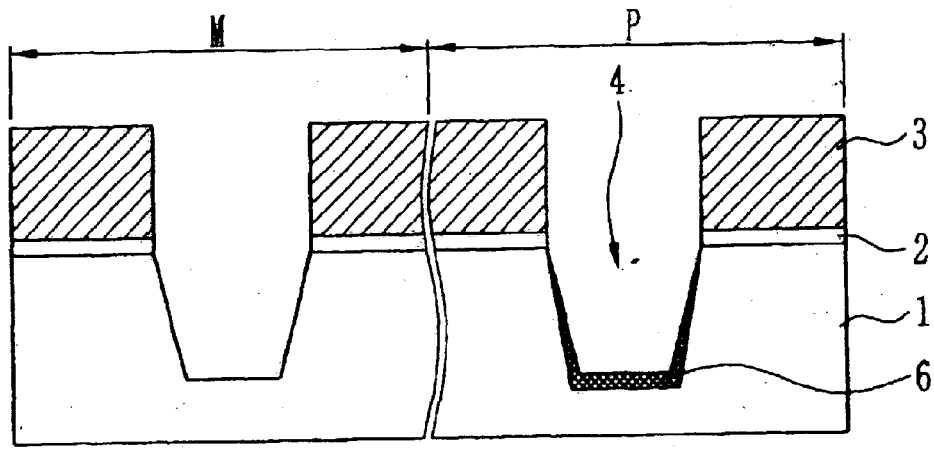

FIG. 2C illustrates the cross-sectional of the semiconductor device in which a mask layer 5 is formed on the entire structure, the mask layer 5 is patterned so that the peripheral circuit region P is exposed, and the inert ion is then implanted into the surface of the trench 4 of the exposed peripheral circuit region P. FIG. 2D illustrates the cross-sectional of the semiconductor device in which the mask layer 5 is removed to form an amorphous layer 6 in the silicon substrate 1 of the surface of the trench 4 in the peripheral circuit region P due to implantation of the inert ion.

The inert ion may include silicon (Si) or argon (Ar) ion. The silicon (Si) ion is implanted with energy of 5~50 KeV at the dose of 1E13~1E16 cm$^{-2}$. The silicon (Si) ion is implanted with energy of 5~50 KeV at the dose of 1E14 ~1E16 cm$^{-2}$, wherein a high-current ion implanter is used so that the ion of over given amount is sufficiently implanted in a direction vertical to the substrate (0°). At this time, as the pad nitride film 3 of the exposed peripheral circuit region P will be removed later, contamination of the active region due to the ion does not occur.

Figure 2E:
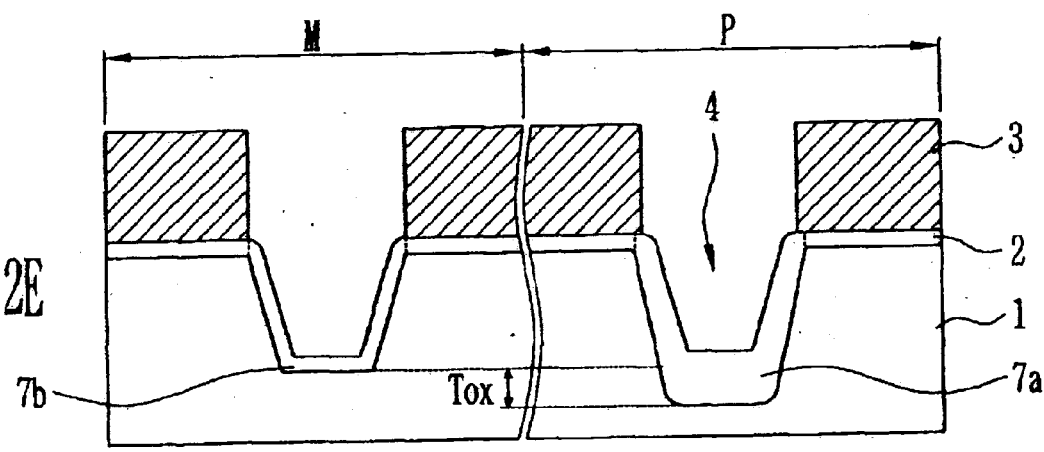

FIG. 2E illustrates the cross-sectional of the semiconductor device for which an oxidization process is performed in order to mitigate damage of the silicon substrate 1 generated during the etch process for forming the trench 4 and make rounded the edge of the trench 4. Oxide films 7a and 7b are formed on the surface of the trench 4 in the memory cell region M and the peripheral circuit region P by means of the oxidization process. At this time, as excessive oxidization proceeds in the amorphous layer 6 into which the ions are injected, the oxide film 7a formed on the surface of the trench 4 in the peripheral circuit region P is thicker than the oxide film 7b formed on the surface of the trench 4 in the memory cell region M. Thus the depth of the trench 4 in the peripheral circuit region P is increased by a thickness Tox.

The oxidization process is implemented at a temperature of 800~1100° C. to a target thickness of 30~150 Å.

Figure 2F:
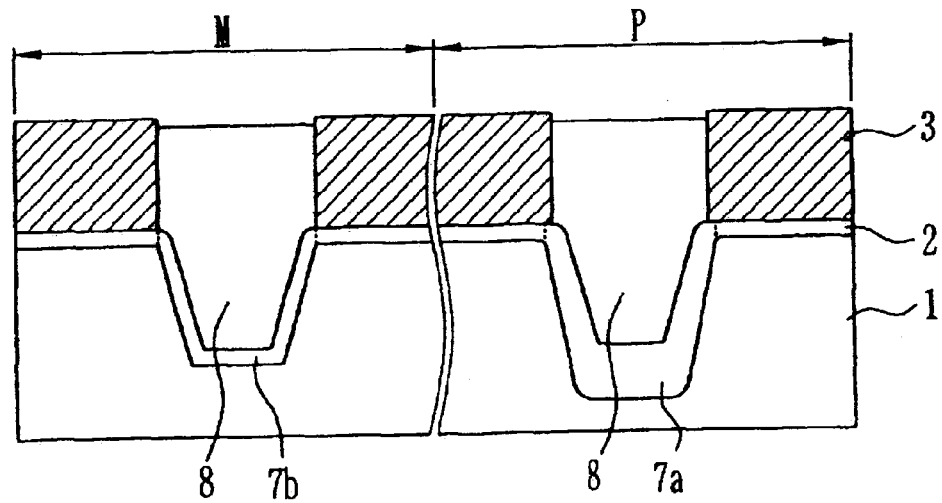

FIG. 2F illustrates the cross-sectional of the semiconductor device in which a high-density plasma oxide film is thickly formed in thickness of 4000~1000 Å on the entire structure so that the trenches 4 in the memory cell region M and the peripheral circuit region P are buried, and is then planarized by means of chemical mechanical polishing process, thus forming isolation films 8 within the trench 4.

Meanwhile, the ions such as arsenic (As), phosphorous (P), boron difluoride (BF$_2$), and the like are experienced by transient enhanced diffusion (TED) or oxidation enhanced diffusion (OED) in a subsequent annealing process. Due to this, they cause a problem relating to an electrical characteristic such as reduction in the breakdown voltage depending on reduction in the concentration of the ion, and the like. In particular, those ions have structural vulnerability for TED or OED during the annealing process in the furnace. Therefore, in the present invention, in order to getter impurities distributed within the silicon substrate and prevent TED or OED of the ions, an anti-diffusion layer is formed into a given depth of the silicon substrate.

In other words, as shown in FIG. 2D, the inert ion is injected into the trench 4 of the memory cell region M to form the amorphous layer 6. A rapid thermal oxidation (RTO) process using spike annealing is then implemented. By doing so, the injected ion is gettered on the bottom of the trench 4, thus forming the anti-diffusion layer (not shown) having distribution of the ions as in FIG. 3. At this time, an oxygen (O$_2$) atmosphere is kept so that the oxide film of a given amount is formed on the surface of the silicon substrate 1 within the trench 4. Also, as oxidization is prohibited if a nitride film exists on the surface of the silicon substrate 1, oxidization is prohibited; the anti-diffusion layer is removed before the annealing process. It is preferred that the spike annealing process is implemented at a temperature of 850~1100° C. and the ramp-up ratio is controlled to be 100~250° C./sec.

The anti-diffusion layer formed thus serves to prevent the ions from being transient-enhanced-diffused toward the bottom of the silicon substrate 1 in a subsequent annealing process.

Figure 3:
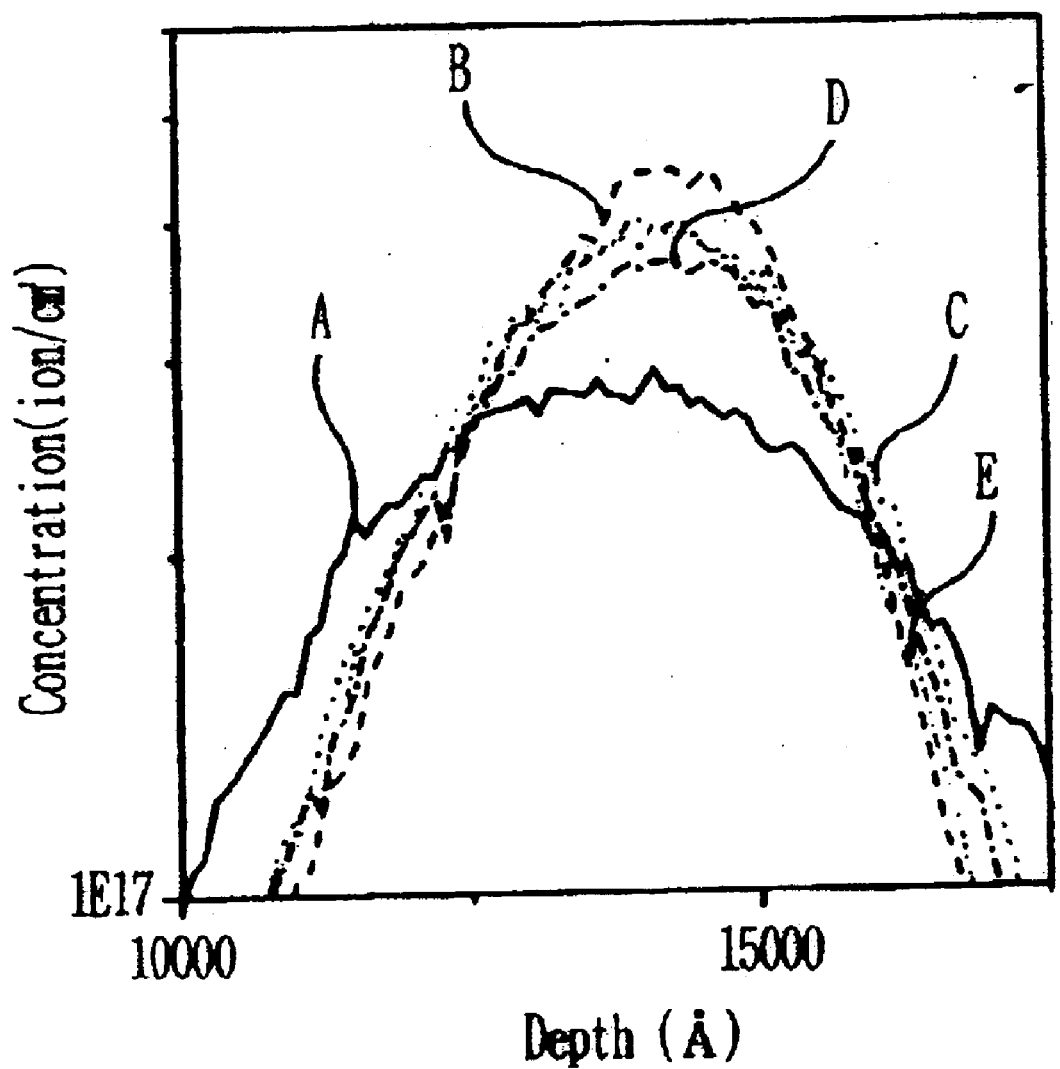
FIG. 3 is a graph illustrating distribution of ions in an anti-diffusion formed according to the present invention.

In FIG. 3, lines represent distribution of the concentration of the ion depending on the depth the line 'A' indicates the ion that is annealed for 30 minutes at a temperature of 950° C., the line 'B' indicates a case that arsenic (As) is implanted, the line 'C' indicates the ion that is annealed for 20 seconds a temperature of 950° C., the line 'D' indicates the ion that is annealed for 10 seconds at a temperature of 1000° C., and the line 'E' indicates the ion that is spike-annealed at a temperature of 1050° C.

As described above, according to the present invention, the trenches are formed in the silicon substrates of the memory cell region and the peripheral circuit region. The inert ion is then injected into the surface of the silicon substrate exposed through the trench in the peripheral circuit region, thus forming the amorphous layer. Thereafter, the oxidization process is implemented so that a thick oxide film is grown due to excessive oxidization at the amorphous layer, thus making thicker the trench in the peripheral circuit region than the trench in the memory cell region by a thickness of the oxide film.

As such, the present invention has the following advantageous effects. First, it is possible to prevent damage due to etch since the oxidization process not a physical etch process is employed. Second, it is possible to minimize damage due to ion implantation since the inert ion having no electrical characteristic is employed, thus improving the electrical characteristic of the device. Third, it could be easily applied to higher-integration devices since the depth of the trench can be easily controlled by adjusting ion implantation energy.

Further, after the amorphous layer is formed through implantation of the inert ion, the implanted ion is gettered on the bottom of the trench by performing the rapid thermal oxidization process using the spike annealing process. Therefore, the present invention has an advantageous effect that it can prevent TED of the ion occurring in a subsequent annealing process.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of forming an isolation film in semiconductor devices, comprising the steps of:

forming a mask pattern on a silicon substrate in a memory cell region and a peripheral circuit region and then etching an exposed portion of the silicon substrate by a given depth to form a shallow trench;

implanting an inert ion into the surface of the trench in the peripheral circuit region;

implementing an oxidization process so that an oxide film is grown on the surfaces of the trenches in the memory cell region and the peripheral circuit region, wherein the depth of the trench in the peripheral circuit region is increased due to excessive oxidization at the portion in which the ion is implanted; and forming an oxide film on the entire structure so that the trench is buried and planarizing the surface of the oxide film.

2. The method as claimed in claim 1, wherein the mask pattern consists of a pad oxide film and a pad nitride film.

3. The method as claimed in claim 1, wherein the trenches have sidewalls having a tilt angle of 80~85°.

4. The method as claimed in claim 1, wherein the inert ion is entire silicon (Si) or argon (Ar).

5. The method as claimed in claim 4, wherein the silicon (Si) ion is implanted with energy of 5~50 KeV at the dose of 1E13~1E16 cm$^{-2}$.

6. The method as claimed in claim 4, wherein the argon (Ar) ion is implanted with energy of 5~50 KeV at the dose of 1E14~1E16 cm$^{-2}$.

7. The method as claimed in claim 1, wherein the oxidization process is implemented at a temperature of 800~1100° C. to a target thickness of 30~150 Å.

8. The method as claimed in claim 1, wherein the planarization is performed by means of a chemical mechanical polishing method.

9. A method of forming an isolation film in semiconductor devices, comprising the steps of:

forming a mask pattern on a silicon substrate in a memory cell region and a peripheral circuit region and then etching an exposed portion of the silicon substrate by a given depth to form a shallow trench;

implanting an inert ion into the surface of the trench in the peripheral circuit region;

performing a rapid thermal oxidization process in order to an anti-diffusion layer is formed at the bottom of the trench implementing an oxidization process so that an oxide film is grown on the surfaces of the trenches in the memory cell region and the peripheral circuit region, wherein the depth of the trench in the peripheral circuit region is increased due to excessive oxidization at the portion in which the ion is implanted; and forming an oxide film on the entire structure so that the trench is buried and planarizing the surface of the oxide film.

10. The method as claimed in claim 9, wherein the mask pattern consists of a pad oxide film and a pad nitride film.

11. The method as claimed in claim 9, wherein the trenches have sidewalls having a tilt angle of 80~85°.

12. The method as claimed in claim 9, wherein the inert ion is entire silicon (Si) or argon (Ar).

13. The method as claimed in claim 12, wherein the silicon (Si) ion is implanted with energy of 5~50 KeV at the dose of 1E13~1E16 cm$^{-2}$.

14. The method as claimed in claim 12, wherein the argon (Ar) ion is implanted with energy of 5~50 KeV at the dose of 1E14~1E16 cm$^{-2}$.

15. The method as claimed in claim 9, wherein the rapid thermal oxidization process is performed by means of a spike annealing process.

16. The method as claimed in claim 15, wherein the spike annealing process is implemented at a temperature of 850~100° C. and the ramp-up ratio is controlled to be 100~250° C./sec.

17. The method as claimed in claim 9, wherein the oxidization process is implemented at a temperature of 800~1100° C. to a target thickness of 30~150 Å.

18. The method as claimed in claim 9, wherein the planarization is performed by means of a chemical mechanical polishing method.

* * * * *

UNITED STATES PATENT AND TRADEMARK OFFICE
CERTIFICATE OF CORRECTION

PATENT NO.     : 6,762,103 B2
DATED          : July 13, 2004
INVENTOR(S)    : Noh Yeal Kwak et al.

It is certified that error appears in the above-identified patent and that said Letters Patent is hereby corrected as shown below:

<u>Title page,</u>
Item [75], Inventors, please delete "Ichon-Shi" and replace with -- Kyungki-Do --.

<u>Column 6,</u>
Line 58, please delete "100°C." and replace with -- 1100°C --.

Signed and Sealed this

Fourteenth Day of December, 2004

JON W. DUDAS
*Director of the United States Patent and Trademark Office*